United States Patent [19]
Landeta et al.

[11] Patent Number: 5,373,466
[45] Date of Patent: Dec. 13, 1994

[54] FLASH-CLEAR OF RAM ARRAY USING PARTIAL RESET MECHANISM

[75] Inventors: David S. Landeta; William R. Young; Charles W. T. Longway, all of Palm Bay, Fla.

[73] Assignee: Harris Corporation, Melbourne, Fla.

[21] Appl. No.: 858,310

[22] Filed: Mar. 25, 1992

[51] Int. Cl.$^5$ .............................................. G11C 7/00
[52] U.S. Cl. ............................... 365/189.01; 365/154; 365/156; 365/218; 365/190; 257/903; 257/904
[58] Field of Search ............. 365/154, 156, 190, 218, 365/189.01; 257/903, 904

[56] References Cited

U.S. PATENT DOCUMENTS

| | | | |
|---|---|---|---|
| 4,162,540 | 7/1979 | Ando | 365/194 |
| 4,348,746 | 9/1982 | Okabayashi et al. | 365/182 |
| 4,777,623 | 10/1988 | Shimazu et al. | 365/154 |
| 4,789,967 | 12/1988 | Liou et al. | 365/189 |
| 4,879,687 | 11/1989 | Okamoto et al. | 365/200 |
| 4,928,266 | 5/1990 | Abbott et al. | 365/189.01 |
| 5,212,663 | 5/1993 | Leong | 365/189.01 |

FOREIGN PATENT DOCUMENTS 2623321 5/1989 France .

*Primary Examiner*—Eugene R. LaRoche
*Assistant Examiner*—Andrew Q. Tran
*Attorney, Agent, or Firm*—Charles E. Wands

[57] ABSTRACT

A reset mechanism for a random access memory array comprises an auxiliary reset circuit, which does not require modification of the contents of the memory itself. For a random access memory capable of storing M, N-bit words, the auxiliary mechanism includes a plurality of M reset state circuits that are respectively associated with the M words of memory. The reset state circuit preferably comprises an additional 'resetable' memory cell for each word of memory, which is integrated within the structure of the memory itself. In order to reset one or more words of memory, the associated reset state circuits are placed in a reset state-representative condition. The state of each reset state circuit is used to controllably mask (e.g. is logically ANDed with) the contents of its associated word of memory, whenever that word is read out. If the reset memory cell has been cleared, then regardless of the contents of its associated word in memory, the mask will cause the addressed memory word to be output as all zeros. Whenever a new word value is written to memory, its associated reset state circuit is simultaneously accessed and a valid or non-reset representative '1' bit is stored in that reset state circuit. Subsequently, when that word is read out from memory, the ('1') value of the mask bit stored in its associated reset cell will cause the contents of the word to be output as is.

21 Claims, 7 Drawing Sheets

FLASH-CLEAR OF RAM ARRAY USING PARTIAL RESET MECHANISM

FIELD OF THE INVENTION

The present invention relates in general to semiconductor memory circuits and is particularly directed to a mechanism for effectively resetting a random access memory by the incorporation of an auxiliary reset control circuit array of reduced circuit capacity, the components of which are separate from, but associated with, the respective words of the random access memory.

BACKGROUND OF THE INVENTION

The resetting of a random access memory customarily involves clearing or 'zeroing' the contents of all of the storage locations or cells of the memory, typically by addressing each storage location and writing a '0' into each cell in response to the occurrence of a reset control signal. Because the transient peak current required to clear the entire memory array is quite large and may entail several clock cycles of the memory access clock, such a mechanism is undesirably slow and necessitates a substantial amount of semiconductor real estate in which to form the attendant current driver.

One approach to solve this problem, described in the U.S. Pat. No. to Liou et al 4,789,967, is to segment the resetting process into sub-portions or blocks of memory, in an effort to provide some degree of reduction in both reset current requirements and to provide a degree of improvement in reset speed (by resetting only selected portion or portions of memory of interest). Unfortunately, the resetting mechanism described in the Liou et al patent still requires applying a reset current directly to the memory itself, so that even though less than the entire memory may be selectively accessed, the reset operation still involves modifying the contents of a plurality of memory cells in each of the blocks of memory to be reset.

SUMMARY OF THE INVENTION

In accordance with the present invention, rather than modified or clear the contents of each storage location of one or more segments or blocks of memory for the purpose of an overall reset or a partial reset of memory, an auxiliary reset mechanism, which is separate from and does not require modification of the contents of the memory itself, is employed. In general, the memory with which the present invention may be employed may comprise any read/write technology, such as NMOS, PMOS, CMOS, bipolar, GaAs, and magnetic circuits.

For a random access memory capable of storing M, N-bit words, the inventive auxiliary mechanism preferably comprises a plurality of M reset state circuits that are respectively associated with the M words of memory. The reset state circuit may comprise an additional 'resetable' memory cell for each word of memory, which is integrated within the actual physical structure of the memory itself, or it may be formed of a separate multi-cell unit, which is used in association with write-in and read-out accesses to the memory. The additional multi-reset circuit unit need not be formed of memory cells, proper, but may be formed of a plurality of reset logic circuits. In a preferred embodiment, the resetable memory cell of the present invention is implemented as a dual port 'nine transistor (9T)' CMOS-configured memory cell.

In order to reset one or more words of memory, the associated reset state circuits are placed in a reset state-representative condition. Where the multi-reset state unit is formed of resetable memory cells, initializing the reset state circuits involves resetting such resetable memory cells. The contents or state of each reset state circuit is used to controllably mask the contents of its associated word of memory, whenever that word is read out. The masking mechanism may include any suitable logic operator, such as AND, NAND, NOR and OR functions.

If the reset memory cell has been cleared, then regardless of the contents of its associated word in memory, the mask will cause the addressed memory word to be output as all zeros. Whenever a new word value is written to memory, its associated reset state circuit is simultaneously accessed and a valid or non-reset representative '1' bit is stored in that reset state circuit. Subsequently, when that word is read out from memory, the ('1') value of the mask bit stored in its associated reset cell will cause the contents of the word to be output as is.

Where the memory is implemented as a J column by K row array of dual port CMOS-configured memory cells for storing K, J-bit words, the reset mechanism may be integrated with the MOSFET-configured memory array as an additional or (J+1)th column of K single-bit, resetable MOSFET-configured memory cells, respectively associated with the K, J-bit words. Each of the MOSFET-configured memory cells of this additional column preferably has essentially the same configuration as the respective cells of the memory proper, and also includes a 'reset' MOSFET formed of an additional length or strip of insulated polysilicon disposed along a column of reset MOSFETs of the cell. A plurality of gate tabs extend over a thin layer of gate oxide between the drain and source of adjacent MOSFETs of a respective memory cell. The drain and source of the 'reset' MOSFET are common with drain region and source region of the adjacent MOSFETs, so that no rearrangement of the regions of the MOSFETs of the dual port CMOS memory cell topology is required.

The additional length of polysilicon is coupled to receive a reset control signal. When a reset signal is applied to the polysilicon reset link, it propagates or 'ripples' along the link, so that the reset MOSFETs are sequentially turned on. thereby causing the resetable memory cells to be successively reset. The time required to reset the cells of a reset memory cell column depends upon the overall effective RC time constant of the polysilicon line. The overall effective RC time constant is governed by the interconnect capacitance resistance of the polysilicon line and the parasitic gate capacitance of a reset MOSFET. To increase the speed at which the reset MOSFETs are reset, the geometry and interconnect configuration of the polysilicon link modified from an elongated strip to a serpentine path among the cells, with multiple distribution and loopback ties along the link, so that multiple groups of the reset transistors may be 'ripple-reset' in parallel fashion. Where the memory employs multiple columns of reset memory cells, one reset line may be located between adjacent columns of reset memory cells with tab extensions to either side of the reset line.

Once the memory has been reset, then whenever a data word is written to memory, a '1' is written to its associated resetable memory cell of the KX1 array, thereby placing that associated resetable memory cell in a non-reset condition.

DETAILED DESCRIPTION

Figure 1:
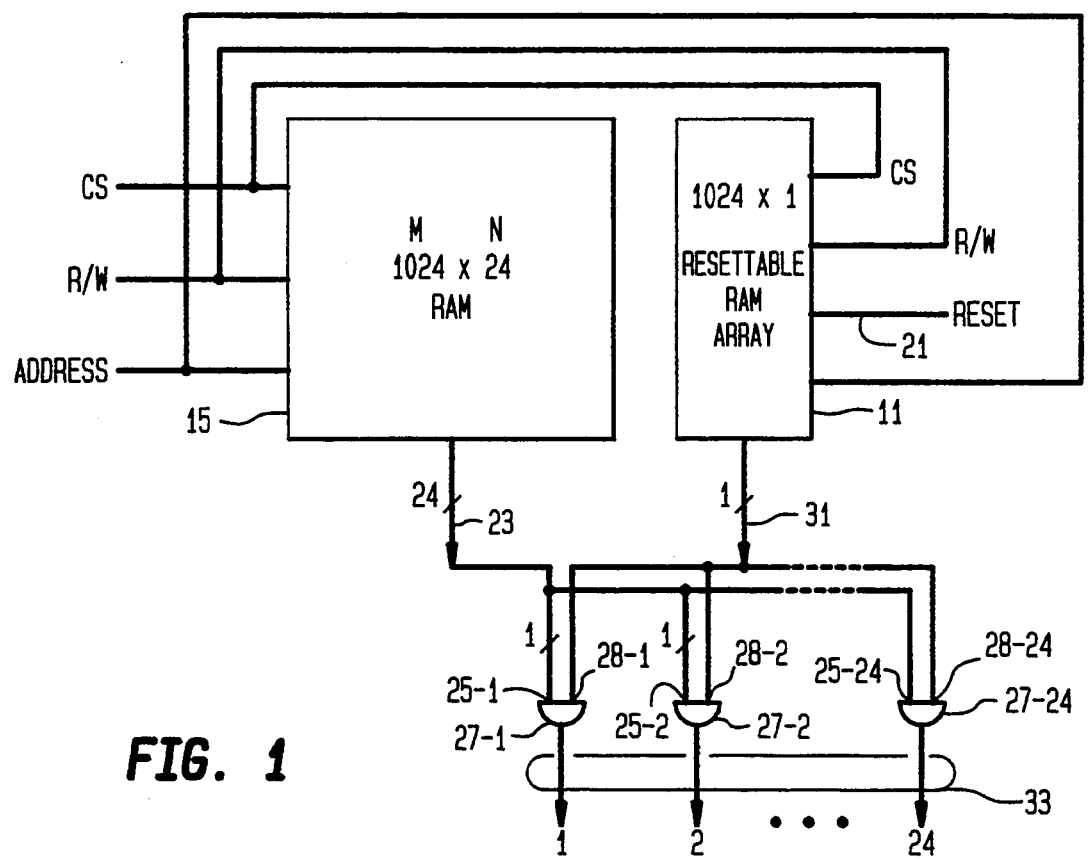
FIG. 1 diagrammatically illustrates an embodiment of a JXK memory array and an associated KX1 reset state circuit array in accordance with the present invention.

Before describing in detail the particular improved memory reset mechanism in accordance with the present invention, it should be observed that the present invention resides primarily in a novel structural combination of conventional signal processing circuits and components and not in the particular detailed configurations thereof. Accordingly, the structure control and arrangement of these conventional circuits and components have been illustrated in the drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major structural components of the system in a convenient functional grouping, whereby the present invention may be more readily understood.

As was described previously, the customary mechanism for resetting one or more words in a memory array has been to reset or clear (write a '0' into) the actual storage locations of the memory array. Thus, to reset the entirety of a memory array conventionally requires a write access to each storage location, which is both a time-consuming and large current-demanding operation. In accordance with the present invention, rather than modify or clear the contents of each storage location of the entire memory or, as proposed by the scheme detailed in the Liou et al '967 patent, each storage location in blocks of memory, reset is accomplished exclusive of the contents of the memory array proper.

FIG. 1 diagrammatically illustrates a first embodiment of the present invention which comprises a reset state circuit 11 and a mask circuit 13 coupled with a random access memory array 15. Random access memory array 15 may comprise any conventional memory array configuration, such as a J column by K row memory cell array capable of storing M×N memory words. For purposes of an illustrative example, memory 15 may comprise a J=24 column by K=1024 row memory cell array, for storing M=1024 words, each of which is N=24 bits wide. Namely, each row of the array stores a twenty-four bit word, while each column is associated with a respective bit.

Reset state circuit 11 serves as an auxiliary storage unit for storing reset status information for each of the respective words in memory array 15 and access to circuit 11 does not also require access to the memory array itself for resetting one or more words in the array. For the illustrated example of a 1024×24 cell array for storing M=1024 N=24 bit words, auxiliary reset state storage unit 11 may comprise a corresponding plurality of M=1024 reset state circuits that are respectively associated with the M=1024 24 bit words of memory 15. For this purpose, reset state circuit 11 may comprise an additional one bit-wide (1024×1) array of resetable memory cells that is separate from the memory 15. Respective address lines for memory 15 are also coupled in parallel to reset cell array 11, so that whenever one of the words (in the present example one of the 1024 rows) of memory 15 is accessed, its associated reset state cell in one bit wide array 11 is also addressed.

In order to reset one or more words of memory, the associated reset state circuit or circuits of array 11 are placed in a reset state-representative condition (reset or written with a '0'). Where the multi-reset state unit is formed of resetable memory cells that are directly resetable without having to write a '0' into the cell (as may be effected by using the resetable memory cell shown in FIGS. 7, 8 and 9, to be described below) placing the reset state circuits in a reset state involves coupling a reset signal to a reset link 21, so that the reset signal may propagate throughout the array and effectively reset each cell within the array. Alternatively one or more reset links may be used to reset individual ones or groups of reset cells, depending upon the circuit configuration chosen. An external array may have separate reset lines associated with the respective cells of the array, or may be configured such that all words may be written in parallel to the reset state.

For purposes of the present description, reset link 21 is internally coupled to each of the resetable cells of array 11, so that a single reset control signal effectively causes the resetting of all the cells of array 11.

As pointed out previously, the contents or state of each reset state circuit (or reset state memory cell) within array 11 is used to controllably mask the contents of its associated word of memory array 15 whenever that word is read out. If the reset memory cell is cleared, then regardless of the states of the bits of its associated word in memory, the mask will cause the addressed memory word to be output as all zeros. This masking operation is readily carried out by logically ANDing the contents of a respective word read out of memory 15 with its associated reset state mask bit stored in reset state array 11. In the present example, therefore, the twenty-four column lines 23 of memory 15 are coupled to respective first inputs 25-1 . . . 25-24 of twenty-four two input AND gates 27-1 . . . 27-24. A mask input 28 of each AND gate 27 is coupled in common to the single column link 31 from reset state memory array 15. AND gates 27-1 . . . 27-24 provide an N=24 bit output link 33 from which the word accessed from memory 15 is derived.

As pointed out above, whenever one of the 1024 rows of memory 15 is read out, its associated reset state cell in one bit wide array 11 is also addressed. If each of the cells in array 11 has been reset, then its mask output link 31 will be a '0' for any address to be read out, so that the output of AND gate 27 will be all zeroes. Thereafter, whenever a new word value is written to memory 15, its associated reset state circuit within array 11 is correspondingly accessed and a valid or non-reset representative '1' bit is stored in that reset state circuit. Subsequently, when that word is read out from memory 15, the ('1') value of the mask bit stored in its associated reset cell, when ANDed with the contents of link 23, will cause the contents of the word to be output on link 33.

Figure 2:
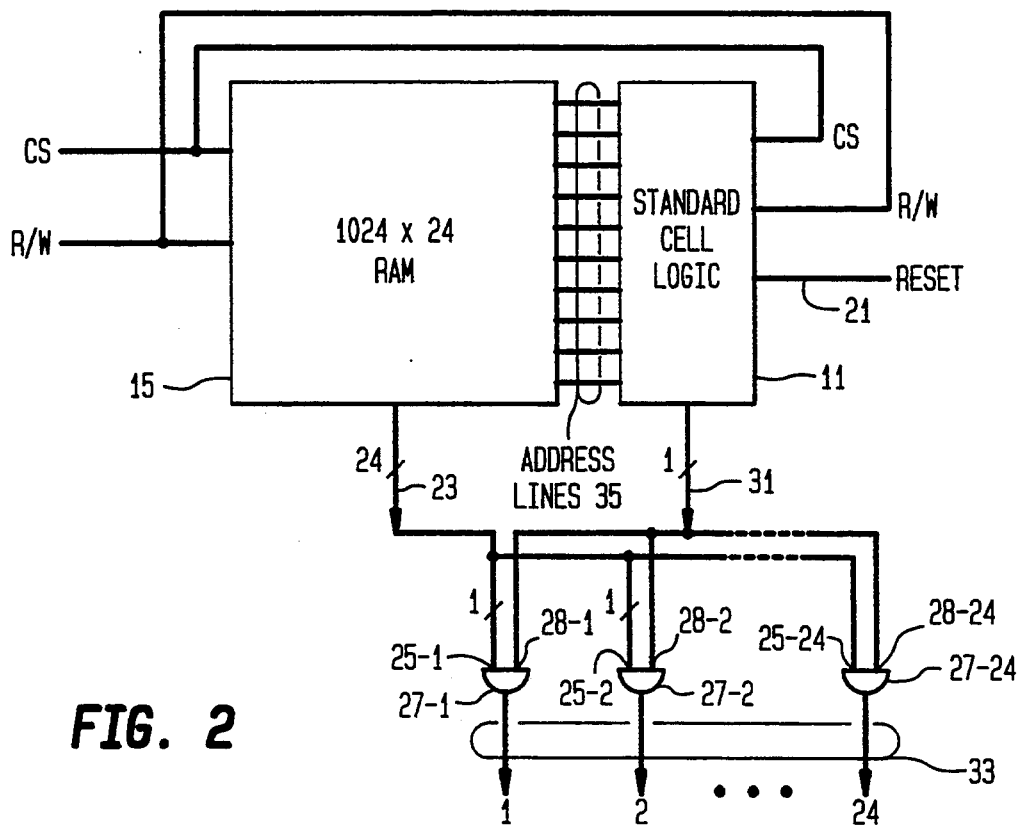
FIG. 2 diagrammatically shows a modification of the embodiment of FIG. 1, in which the reset state circuit is formed of a plurality of standard logic circuits, respective address lines for which are coupled in parallel with the row address lines for the array.

Although the reset mask array 11 of the embodiment shown in FIG. 1 has been described as being formed of a multi-cell, one bit wide memory array, it need not be formed of memory cells, proper, but, in general, may be formed of a plurality of standard logic circuits 11, respective address lines 35 for which are coupled in parallel with the row address lines for the array 15, as diagrammatically illustrated in FIG. 2.

Figure 3:
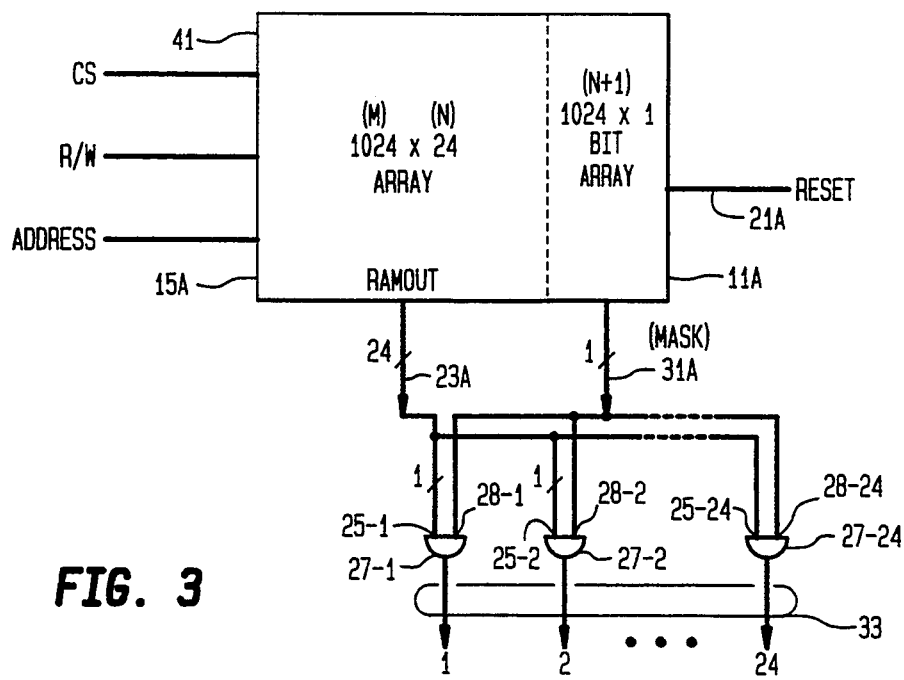
FIG. 3 diagrammatically illustrates an auxiliary, one-bit wide reset mask array integrated with a memory array as an additional column of M single bit resetable memory cells.

In accordance with a preferred embodiment of the present invention, diagrammatically illustrated in FIG. 3, an auxiliary, one-bit wide reset mask array is integrated with a memory array 41 as an additional or (N+1)st column 11A of M single bit resetable memory cells, respectively associated with the M=1024, N=24 bit words of a 1024 X twenty-four bit wide portion word storage portion 15A of the memory. In accordance with a preferred implementation of the cells of the word storage portion 15A of the memory array 41, each cell is formed of a pair of MOSFET-configured cross-coupled inverter circuits, schematically illustrated in FIG. 4, as cross-coupled inverter circuits 51, 53 having a semiconductor wafer topology illustrated in FIGS. 5 and 6, which show a memory topology layout for a group of four memory cells 15-1, 15-2, 15-3 and 15-4 within the overall array. (In the circuit illustration of FIG. 4 and the topology layout of FIGS. 5 and 6, respective source, drain and gate electrodes are denoted by S, D and G labels associated with the respective MOSFET symbols P0, P1 and N0-N5).

Cross-coupled inverter circuits 51, 53 (comprised of respective N and P channel MOSFET pairs N0/P0 and N1/P1) have respective complementary outputs 61, 63 coupled via common-connected pairs of N channel access MOSFETs N2, N4 and N3, N5 to pairs of bit lines 71A, 71B and 71ABAR, 71BBAR, respectively. The memory cell is addressed by way of address ports 81A, 81B, which are respectively coupled to the gate electrodes (G) of access N-channel MOSFETs N2, N3 and N4, N5.

Figure 4:
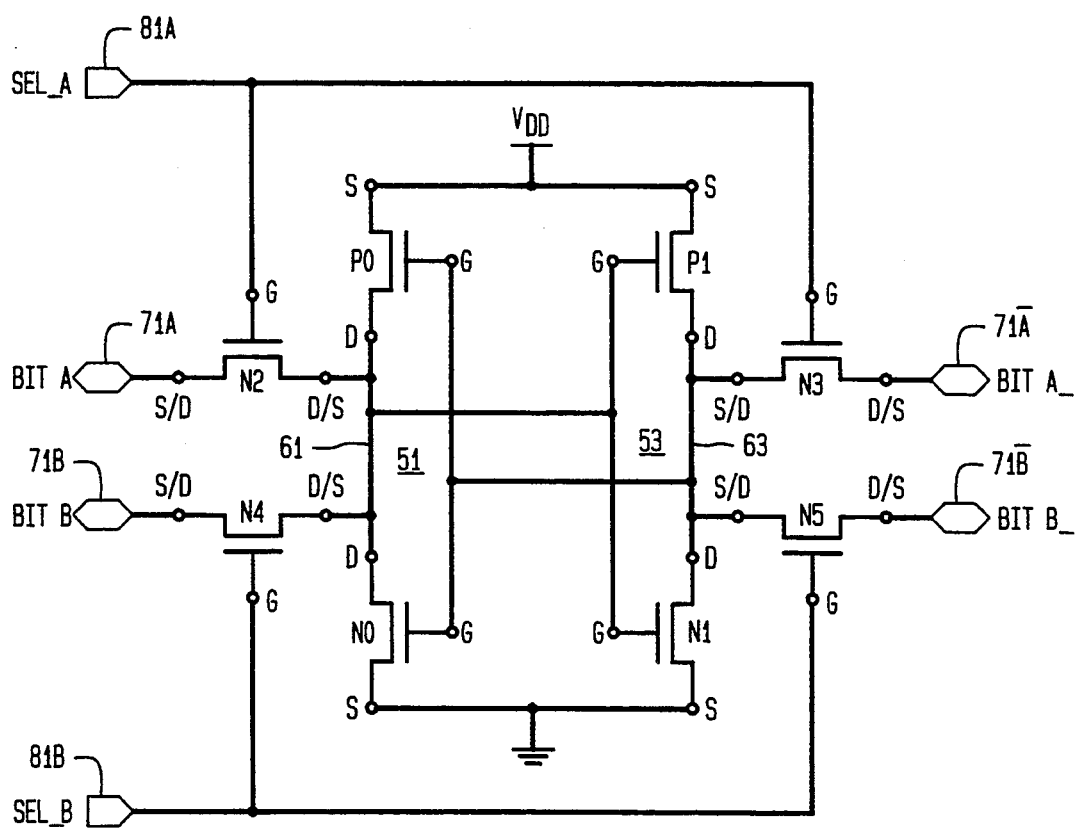
FIG. 4 is a schematic diagram of a dual port CMOS-configured memory cell that may be employed in the word storage portion of the memory array of FIG. 3.
Figure 5:
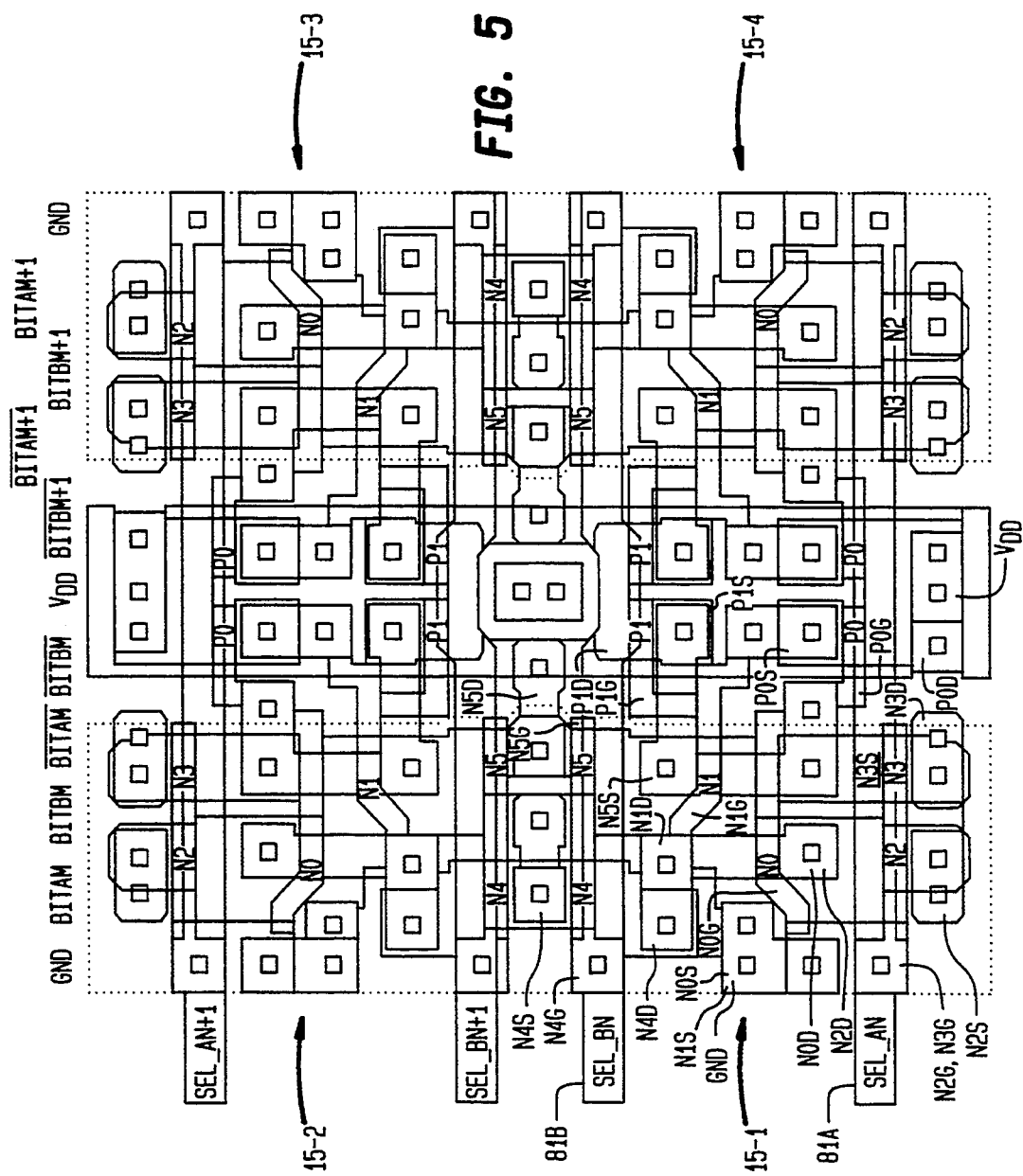
FIGS. 5 and 6 show a semiconductor wafer topology for implementing an array of plural ones of the memory cell shown in FIG. 4.

It should be observed that the invention is not limited to use with the particular eight transistor memory cell structure illustrated in FIGS. 4 and 5, but other memory cell configurations may be employed without departing from the functionality and use of the auxiliary reset mask scheme herein described. For example, rather than use a dual port memory cell, a single port memory cell may be used. In the latter case one of the pairs of access MOSFETS and their associated bit and access lines are not employed, so that for the circuit shown in FIGS. 4 and 5, the single port version would contain six, rather than eight, MOSFETs. The dual port version of FIGS. 4 and 5 has the advantage of allowing a write operation to one cell in the memory to take place simultaneously with a read out operation of another memory cell. Also, simultaneous, dual read out of the same cell may be accomplished via both the A and B access ports.

Figure 6:
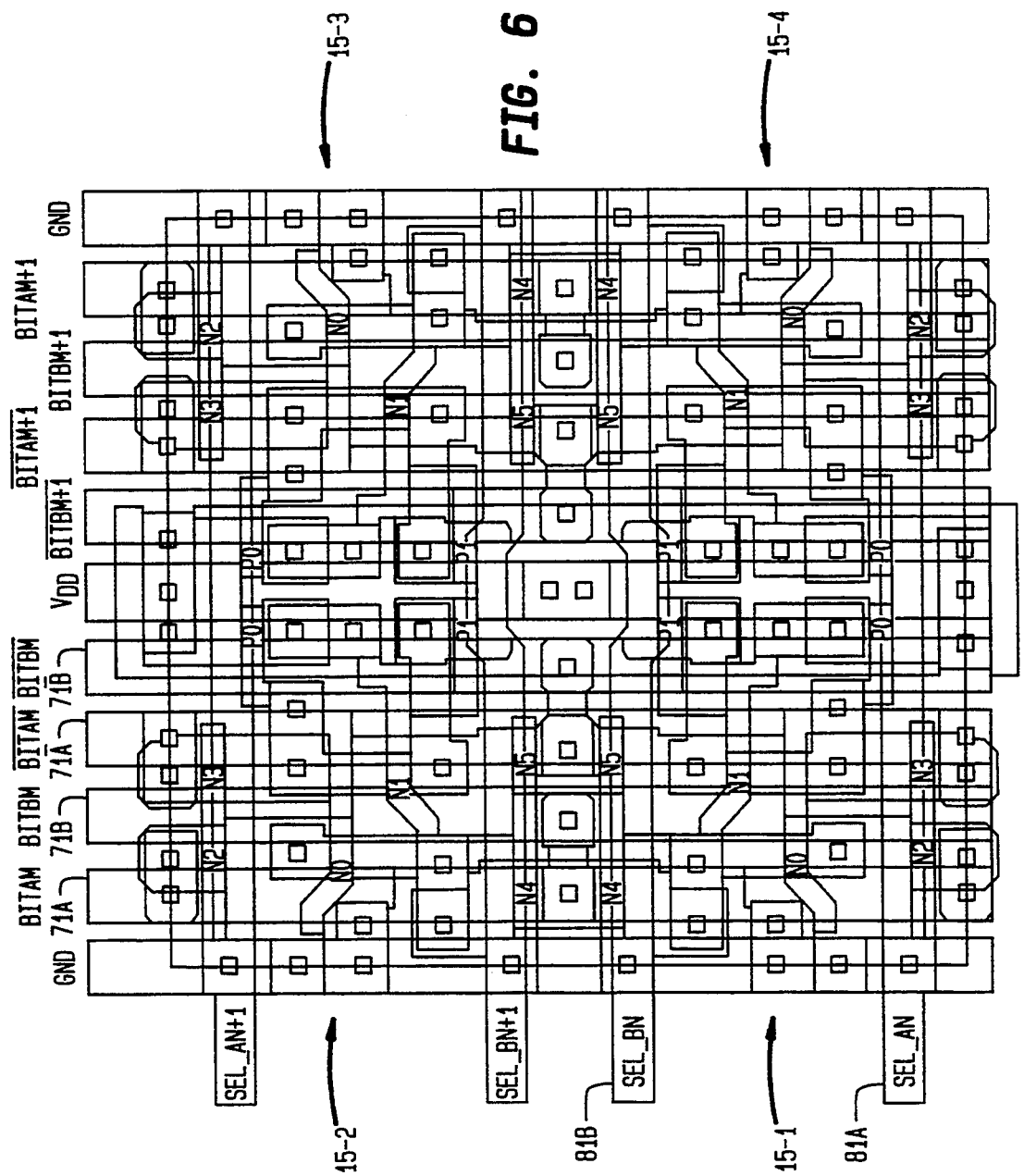
Figure 7:
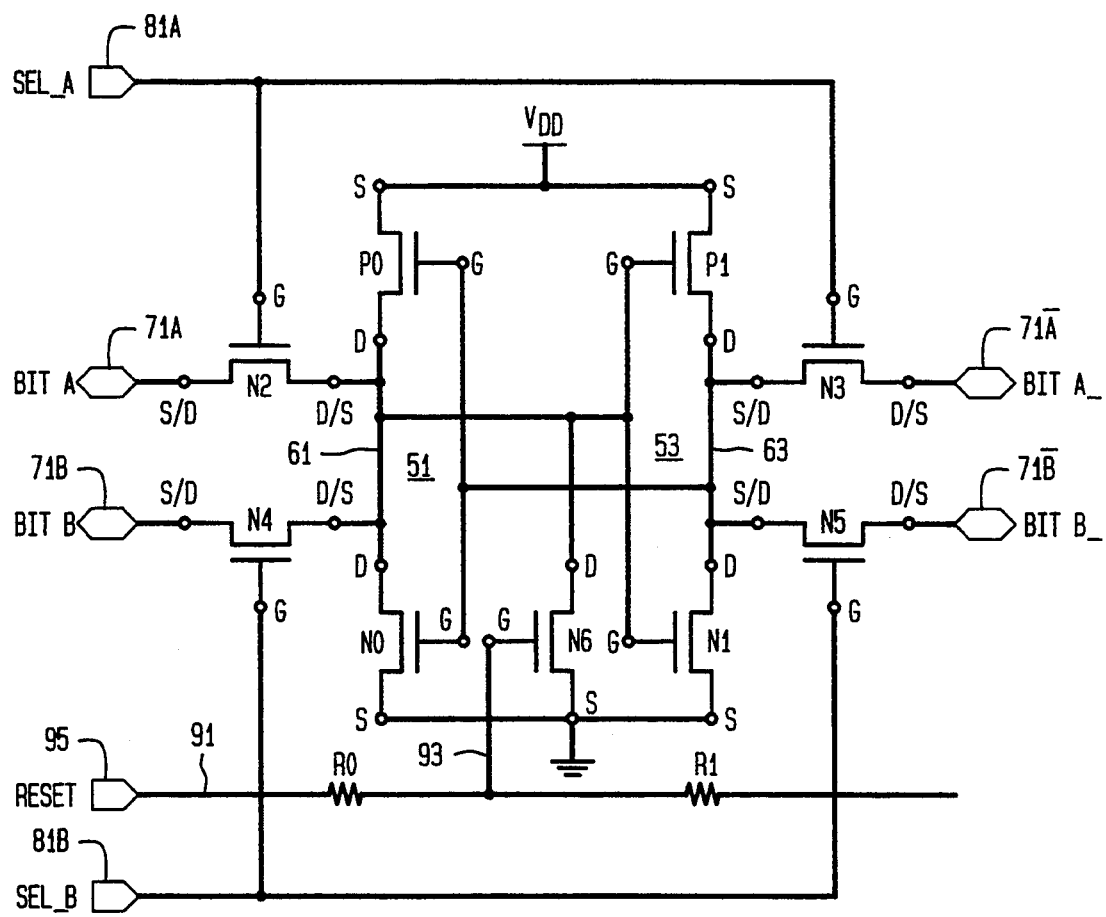
FIG. 7 is a schematic diagram of an enhancement of the dual port MOSFET-configured memory cell of FIG. 4 to provide a reset MOSFET.
Figure 8:
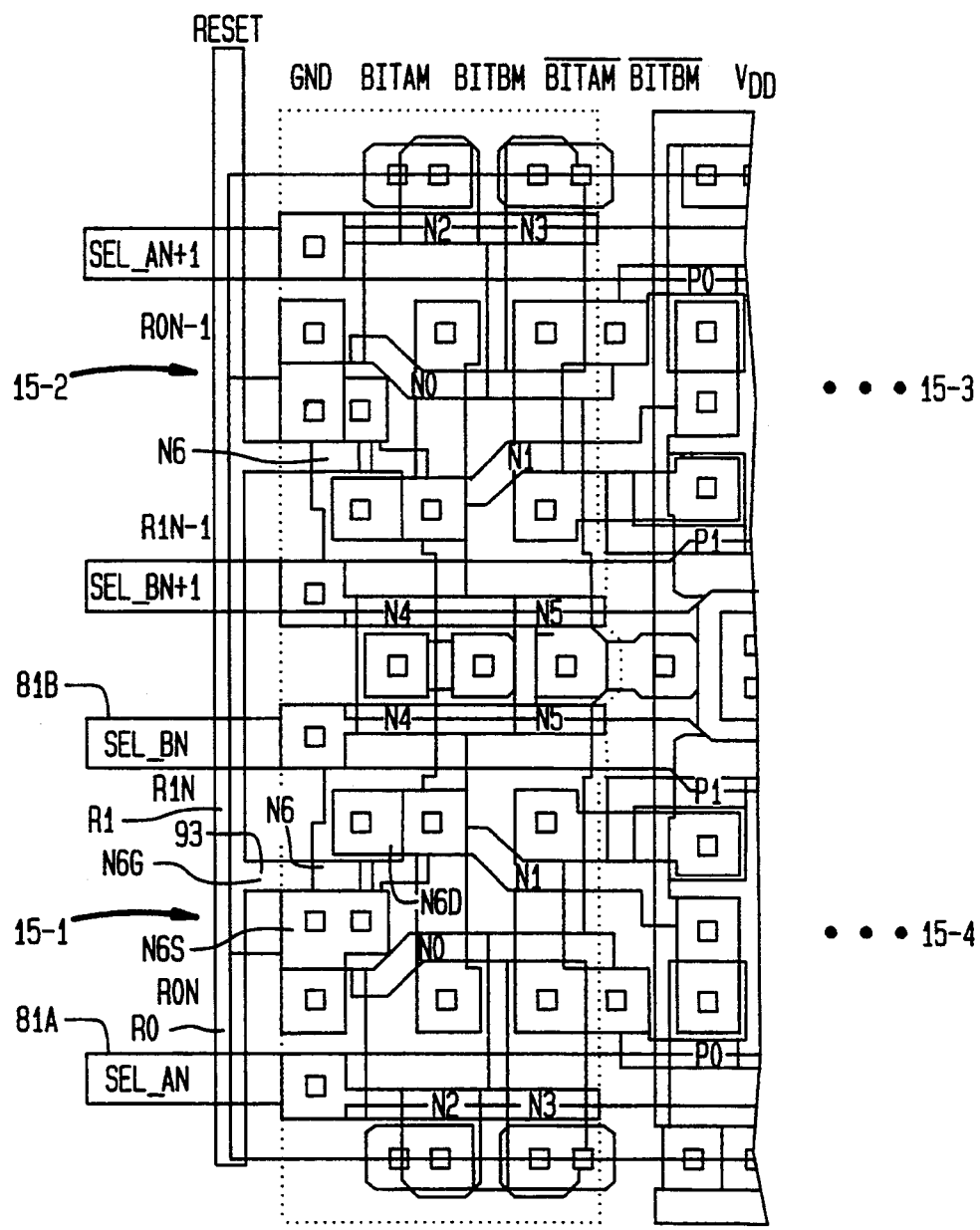
FIGS. 8 and 9 show a semiconductor wafer topology for implementing an array of plural ones of the reset memory cell of FIG. 7.
Figure 9:
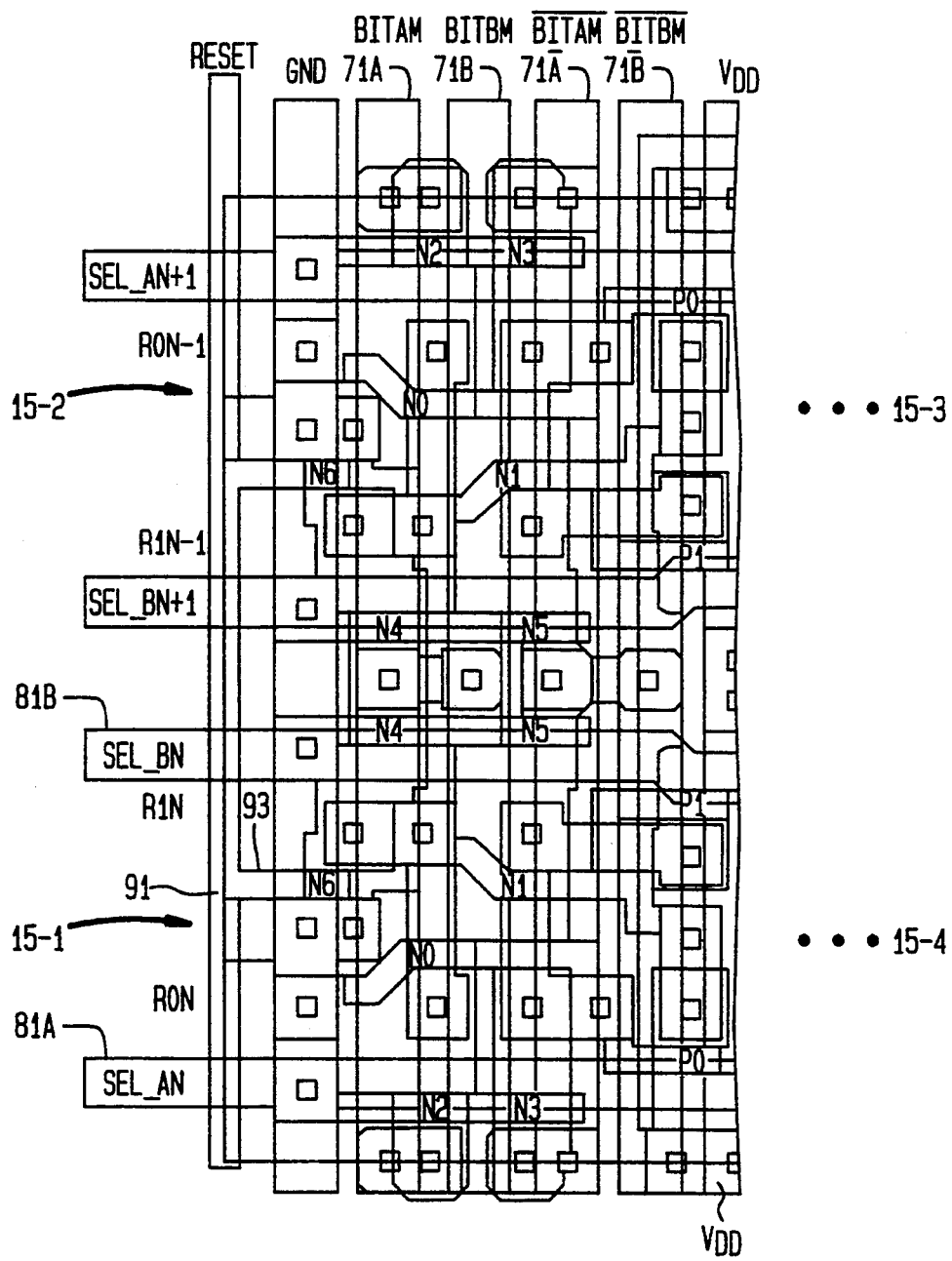

In accordance with the present invention, the dual port CMOS memory cell configuration of FIGS. 4, 5 and 6 may be augmented in the manner shown in FIGS. 7, 8 and 9 to include a 'reset' control transistor (MOSFET) N6. Advantageously, reset MOSFET N6 may be readily incorporated in the topology layout of FIGS. 5 and 6 by overlaying an additional length of insulated polysilicon 91 that runs along the length of a memory cell column and includes a plurality of gate tabs 93 that extend over a thin layer of gate oxide between the drain/source N4D/S and ground, respectively of a respective memory cell, as shown in the topology layout of FIGS. 8 and 9. The drain N6D and source N6S of the 'reset' MOSFET N6 are common with drain/source region N4D/S and ground, respectively of adjacent MOSFET N4 and ground, so that no rearrangement of the regions of the MOSFETs of the dual port CMOS RAM cell topology of FIGS. 5 and 6 is required. A slight enlargement of the area of the common drain/source region of MOSFETs N4 and ground is illustrated in FIGS. 8 and 9. However, this enlargement does not involve increasing the overall occupation area of the memory cell to accommodate the inclusion of reset transistor N6. Where the memory array incorporates an additional column of reset memory cells to form the integrated structure of FIG. 3, the size of the memory is increased slightly wider than a normal column width for one additional bit (in the word line direction) to provide for the occupation area of polysilicon line 91. Where the parameters of the memory dictate the use of multiple columns of reset memory cells, adjacent columns of reset cells may share the same reset line 91.

The additional length of polysilicon 91 is coupled to a reset terminal 95 to which a reset control input (21A, FIG. 3) is coupled. The resistance imposed by successive segments of polysilicon reset link 91 between tabs 93 to the gate electrodes N6G of the reset transistors N6 is denoted by resistors R0 and R1. When a reset signal is applied to polysilicon reset link 91, for example, to effect a 'flash' clear of the memory, the reset signal propagates or 'ripples' along the link, so each reset MOSFET N6 of each respective cell to which the reset line 91 is connected is sequentially turned on, thereby sequentially causing all of the resetable memory cells to be successively reset. The time required to reset the M (e.g. 1024) cells of the (N+1)st column depends upon the overall effective RC time constant of the polysilicon line 91. The overall effective RC time constant is governed by the interconnect capacitance resistance of the polysilicon line 91 and the parasitic gate capacitance of reset MOSFET N6. To increase the speed at which the MOSFETs N6 are reset, the geometry and interconnect configuration of link 91 may be modified from an elongated strip to a serpentine path among the cells, with multiple distribution and loopback ties along the link, so that multiple groups of the reset transistors may be 'ripple-reset' in parallel fashion. A serpentine resistance path increases overall resistance and length and is slower. Tying the paths in parallel will reduce resistance and thereby increase speed. Where the memory employs multiple columns of reset memory cells, as noted previously, one reset line may be located between adjacent columns of reset memory cells with tab extensions to either side of the reset line. Thus, the configuration chosen is a trade-off between speed and peak power.

As will be appreciated from the foregoing description, rather than modify or clear the contents of each storage location of one or more segments or blocks of memory for the purpose of an overall reset or a partial reset of memory, the present invention provides an auxiliary reset mechanism which, apart from the reset cells, does not require modification of the contents of the memory where the data is stored via the bit and bitBAR input/output lines. For a random access memory capable of storing M, N-bit words, the inventive auxiliary mechanism preferably comprises a plurality of M reset state circuits that are respectively associated with the M words of memory. By a relatively minor modification to an eight transistor, dual port CMOS RAM cell with what essentially amounts to the addition of a layer of polysilicon, it is possible to transform a column of memory cells to a column of reset cells. Resetting of the memory involves merely applying a reset signal to the added polysilicon line, so that the reset signal 'ripples' along the poly line, sequentially resetting each reset cell. Since the state of each reset cell is used to controllably mask the contents of its associated word of memory, on read-out, no direct access to the memory word cells is required. Consequently, both reset current requirements and the length of time to reset the memory are reduced.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A multiple cell memo formed of an array of MOSFET-configured memory cells, each MOSFET-configured memory cell comprising cross-coupled MOSFET inverter circuits to which normal and complementary bit line ports are coupled by way of MOSFET switching circuits that are controlled by a select port to which a word line is coupled, each of selected ones of said MOSFET-configured memory cells, corresponding to MOSFET-configured reset memory cells, including a reset MOSFET coupled to the cross-coupled MOSFET inverter circuits of said reset memory cell, a reset link coupled to each reset MOSFET, said reset link having the property of sequentially propagating a reset signal applied thereto to each reset MOSFET, thereby causing said reset memory cells to be sequentially reset, and wherein, within each reset memory cell, said reset MOSFET has a source/drain region that corresponds to a source/drain region of one of the MOSFETs of said cross-coupled MOSFET inverter circuits and said MOSFET switching circuits of said reset memory cell, and an insulated gate conductive layer overlying a portion of said reset memory cell between said source/drain region of said one of the MOSFETs of said cross-coupled MOSFET inverter circuits and said MOSFET switching circuits of said reset memory cell and a reference potential node, said insulated gate conductive layer being connected to said reset link.

2. A multiple cell memory according to claim 1, wherein said reset link is comprised of resistive material.

3. A multiple cell memory according to claim 1, wherein said reset link is comprised of polysilicon material.

4. A multiple cell memory according to claim 1, wherein said memory is a random access memory formed of an array of dual port, CMOS-configured memory cells.

5. A multiple cell memory according to claim 1, wherein said source/drain region of said reset MOSFET corresponds to a source/drain region of one of the MOSFETs of said MOSFET switching circuits of said reset memory cell, and wherein said insulated gate conductive layer overlies a portion of said reset memory cell between said source/drain region of said one of the MOSFETs of said MOSFET switching circuits of said reset memory cell and said reference potential node.

6. A multiple cell memory according to claim 1, wherein said memory is a random access memory formed of a matrix of rows and columns of MOSFET-configured memory cells, and wherein reset memory cells are located in a selected column of said matrix, and wherein said reset link is coupled to the reset MOSFETs of the memory cells of said selected column of said matrix.

7. A multiple cell memory according to claim 6, wherein said matrix has M rows by N columns of memory cells, thereby forming an array of M, N-bit memory cells, and wherein the N memory cells of each row are coupled to an N-bit output link, se that a row of memory cells will provide an N-bit output word in response to the reading out of the contents of said row of memory cells, and wherein said memory includes M reset memory cells, each of which is associated with a respective one of the M rows of memory cells of said matrix, and a mask circuit coupled to the memory cells of said matrix and to said reset memory cells and being operative to controllably output an N-bit output word accessed from one of the M rows of said matrix in accordance with the state of the reset memory cell associated with said one of the M rows of said matrix.

8. A multiple cell memory formed of an array of MOSFET-configured dual port memory cells, each MOSFET-configured dual port memory cell comprising a pair of cross-coupled MOSFET inverter circuits to which first normal and complementary kit line ports are coupled by way of a first pair of MOSFET switching circuits that are controlled by a first select port to which a first word line is coupled, and to which second normal and complementary bit line ports are coupled by way of a second pair of MOSFET switching circuits that are controlled by a second select port to which a second word line is coupled, each of selected ones of said MOSFET-configured dual port memory cells, corresponding to dual port reset memory cells, including a reset MOSFET coupled to the pair of cross-coupled MOSFET inverter circuits of said dual port reset memory cell, a reset link coupled to each reset MOSFET, said reset link having the property of sequentially propagating a reset signal applied thereto to each reset MOSFET, thereby causing said dual port reset memory cells to be sequentially reset, and wherein, within each dual port reset memory cell, said reset MOSFET has a source/drain region that corresponds to a source/drain region of one of the MOSFETs of said pair of cross-coupled MOSFET inverter circuits and said first and second pairs of MOSFET switching circuits of said dual port reset memory cell, and an insulated gate conductive layer overlying a portion of said MOSFET-configured dual port reset memory cell between said source/drain region of said one of the MOSFETs of said pair of cross-coupled MOSFET inverter circuits and said first and second pairs of MOSFET switching circuits of said dual port reset memory cell and a reference potential node, said insulated gate conductive layer being connected to said reset link.

9. A multiple cell memory according to claim 8, wherein said reset link is comprised of resistive material.

10. A multiple cell memory according to claim 8, wherein said reset link is comprised of polysilicon material.

11. A multiple cell memory according to claim 8, wherein said source/drain region of said reset MOSFET corresponds to a source/drain region of one of the MOSFETs of said first and second pairs of MOSFET switching circuits of said dual port reset memory cell, and wherein said insulated gate conductive layer overlies a portion of said dual port reset memory cell between said source/drain region of said one of the MOSFETs of said first and second pairs of MOSFET switching circuits of said dual port reset memory cell and said reference potential node.

12. A multiple cell memory according to claim 8, wherein said memory is a random access memory formed of a matrix of rows and columns of MOSFET-configured dual port memory cells, and wherein dual port reset memory cells are located in a selected column of said matrix, and wherein said reset link is coupled to the reset MOSFETs of the dual port memory cells of said selected column of said matrix.

13. A multiple cell memory according to claim 12, wherein said matrix has M rows by N columns of dual port memory cells, thereby forming an array of M, N-bit dual port memory cells, and wherein the N dual port memory cells of each row are coupled to an N-bit output link, so that a respective row of dual part memory cells will provide an N-bit output word in response to the reading out of the contents of said respective row of dual part memory cells, and wherein said memory includes M dual port reset memory cells, each of which is associated with a respective one of the M rows of dual port memory cells of said matrix, and a mask circuit coupled to the dual port memory cells of said matrix and to said dual port reset memory cells and being operative to controllably output an N-bit output word accessed from one of the M rows of said matrix in accordance with the state of the dual port reset memory cell associated with said one of the M rows of said matrix.

14. A MOSFET-configured reset memory cell comprising cross-coupled MOSFET inverter circuits to which normal and complementary bit line ports are coupled by way of MOSFET switching circuits that are controlled by a select port to which a word line is coupled, and a reset MOSFET coupled to said cross-coupled MOSFET inverter circuits, a reset link coupled to said reset MOSFET, said reset link having the property of applying a reset signal to said reset MOSFET, thereby causing said reset memory cell to be reset, said reset MOSFET having a source/drain region that corresponds to a source/drain region of one of MOSFETs of said cross-coupled MOSFET inverter circuits and said MOSFET switching circuits of said reset memory cell, and an insulated gate conductive layer overlying a portion of said MOSFET-configured reset memory cell between said source/drain region of said one of the MOSFETs of said cross-coupled MOSFET inverter circuits and said MOSFET switching circuits of said reset memory cell and a reference potential node, said insulated gate conductive layer being connected to said reset link.

15. A MOSFET-configured reset memory cell according to claim 14, wherein said reset link is comprised of resistive material.

16. A MOSFET-configured reset memory cell according to claim 14, wherein said reset link is comprised of polysilicon material.

17. A MOSFET-configured reset memory cell according to claim 14, wherein said source/drain region of said reset MOSFET corresponds to a source/drain region of one of the MOSFETs of said MOSFET switching circuits of said reset memory cell, and wherein said insulated gate conductive layer overlies a portion of said reset memory cell between said source/drain region of said one of the MOSFETs of said MOSFET switching circuits of said reset memory cell and said reference potential node.

18. A MOSFET-configured dual port reset memory cell comprising a pair of cross-coupled MOSFET inverter circuits, to which first normal and complementary bit line ports are coupled by way of a first pair of MOSFET switching circuits, said first pair of MOSFET switching circuits being controlled by a first select port, to which a first word line is coupled, and to which second normal and complementary bit line ports are coupled by way of a second pair of MOSFET switching circuits, said second pair of MOSFET switching circuits being controlled by a second select port, to which a second word line is coupled, said MOSFET-configured dual port reset memory cell including a reset MOSFET coupled to the pair of cross-coupled MOSFET inverter circuits of said dual port reset memory cell, a reset link coupled to said reset MOSFET, said reset link having the property of coupling a reset signal applied thereto to said reset MOSFET, thereby causing said dual port reset memory cell to be reset, and wherein said reset MOSFET has a source/drain region that corresponds to a source/drain region of one of the MOSFETs of said pair of cross-coupled MOSFET inverter circuits and said first and second pairs of MOSFET switching circuits of said dual port reset memory cell, and an insulated gate conductive layer overlying a portion of said MOSFET-configured dual port reset memory cell between said source/drain region of said one of the MOSFETs of said pair of cross-coupled MOSFET inverter circuits and said first and second pairs of MOSFET switching circuits of said dual port reset memory cell and a reference potential node, said insulated gate conductive layer being connected to said reset link.

19. A MOSFET-configured dual port reset memory cell according to claim 18, wherein said reset link is comprised of resistive material.

20. A MOSFET-configured dual port reset memory cell according to claim 18, wherein said reset link is comprised of polysilicon material.

21. A MOSFET-configured dual port reset memory cell according to claim 18, wherein said source/drain region of said reset MOSFET corresponds to a source/drain region of one of the MOSFETs of said first and second pairs of MOSFET switching circuits of said dual port reset memory cell, and wherein said insulated gate conductive layer overlies a portion of said dual port reset memory cell between said source/drain region of said one of MOSFETs of said first and second pairs of MOSFET switching circuits of said dual port reset memory cell and said reference potential node.

* * * * *